United States Patent [19]

Lippmann et al.

[11] Patent Number: 5,709,576
[45] Date of Patent: Jan. 20, 1998

[54] LCD CONNECTOR ALIGNMENT WITH PRINTED WIRING BOARD

[75] Inventors: Raymond Lippmann, Ann Arbor; Michael John Schnars, Clarkston; James Edward Nelson, North Branch; Mark James Miller, Grand Blanc; Gerard Arnold Streelman; Victor David Kruppa, both of Flint, all of Mich.

[73] Assignee: Delco Electronics Corporation, Kokomo, Ind.

[21] Appl. No.: 617,706

[22] Filed: Apr. 1, 1996

[51] Int. Cl.⁶ ........................................... H01J 9/42
[52] U.S. Cl. ............................................. 445/3; 29/834
[58] Field of Search ........................... 445/3; 29/834

[56] References Cited

U.S. PATENT DOCUMENTS 4,415,983  11/1983  Lachmann et al. ................ 364/708
5,358,412  10/1994  Maurinus et al. ................. 439/66
5,412,329   5/1995  Iino et al. ....................... 324/754

Primary Examiner—P. Austin Bradley
Assistant Examiner—Jeffrey T. Knapp
Attorney, Agent, or Firm—Jimmy L. Funke

[57] ABSTRACT

An elastomeric connector couples the terminal pads of an LCD with corresponding terminal pads of a printed wiring board (PWB). Conductive elements in the connector are subject to skewing at such an angle that the LCD must be adjusted relative to the PWB to attain pad alignment. Sense pads on the terminal strips are coupled to contact pads and are arranged so that a continuity test on substantially opposed contact pads will verify pad alignment. In one embodiment, one sense pad is narrower than the terminal pads so that even marginal continuity will assure proper alignment of the terminal pads. In another embodiment, a pair of sense pads on either one of the LCD and the PWB is bracketed by a pair of spaced pads on the other such that continuity is evidence of non-alignment.

15 Claims, 2 Drawing Sheets

5,709,576

LCD CONNECTOR ALIGNMENT WITH PRINTED WIRING BOARD

FIELD OF THE INVENTION

This invention relates to the manufacture of liquid crystal displays (LCDs) and particularly to a method of determining alignment of terminal pads on the LCD with corresponding pads on a printed wiring board (PWB) through an elastomeric connector.

BACKGROUND OF THE INVENTION

Elastomeric connectors are often used to connect LCDs to PWBs. The elastomeric connectors are composed of one or more rows of alternating layers of conductive and insulating compressible material which may be surrounded on the sides by a rubber supporting layer. The elastomeric connector is used in assemblies by mechanically confining its sides and compressing it through its height thereby pressing the conductive elements in the connector onto pads on the PWB and corresponding pads on the LCD. The pitch between conductive elements on the elastomeric connector may be 0.1 mm or finer. It is considered to be good and prudent practice to design elastomeric connection systems so that the pads on the LCD or PWB are at least as wide as the distance spanned by three consecutive conductive elements in the elastomeric connector and that the space between the pads be at least the same width. Under ordinary circumstances in which various tolerancing issues are not important, this guideline insures that at least one conductor in the elastomeric connector makes complete contact with both the LCD and the PWB pads and further that at least one conductor does not make contact between pads.

In applications in which numerous interconnections must be made between the LCD and PWB and in which there is limited space for these connections, the pitch between pads may be small and may approach the limiting case of six conductor pitches in the elastomeric connector. In such cases it is important that the LCD pads and the PWB pads be tightly aligned over one another and that there be a minimal angular skew in the conductive elements in the elastomer between the top and bottom edges of the connector, else conductors in the elastomeric connector might not connect the appropriate pads on the LCD and the PWB. It is also important to be able to ascertain that at least one conductive element in the elastomeric connector make positive contact between appropriate pads. The elastomeric connector is rubbery material and slight movement is possible at higher temperatures and in the presence of vibration. For this reason, it is necessary to insure that at least one conductor is well centered.

Sensing alignment of the connector is particularly important if the distance it spans between the LCD and the PWB is large. Elastomeric connectors are fabricated from large sheets of material which are then cut to the desired width and length. The angle of the cuts has a tolerance and the ends are not perfectly perpendicular with the conductive elements in the connector. Thus, the "tilt" angle of the conductors may adversely effect the connection between the LCD and the PWB. The tilt angle becomes particularly important as the height of the connector increases (the offset in the conductors between the top and bottom edges of the connector is the height of the connector multiplied by the tangent of the tilt angle).

SUMMARY OF THE INVENTION

It is therefore an object of the invention to determine when the conductive elements in an elastomeric connector are correctly aligned with terminal pads of adjacent circuits during assembly of the connector between the circuits. It is another object to assure alignment of such conductive elements with contact pads of a printed wiring board and a liquid crystal display.

In the assembly of LCDs and PWBs, each having an array of terminal pads for coupling to the other via elastomeric connectors, a test is performed to assure proper connection. In the fabrication of the terminal arrays on the PWB and the LCD, one or more sense contact pads is formed on the edge of the LCD and on the PWB for use only for testing for alignment. These sense pads are geometrically spaced so that marginal contact between the ones on the LCD and the PWB via the connection guarantees that the terminal connections are suitably centered. A known voltage source is connected to the sense pad on the LCD by another connection on the connector which is more tolerant of alignment. Electrical circuits detect the voltage on the PWB sense pad and if the known voltage is present, then the connector alignment is adequate.

In one embodiment the sense pad on either the LCD or the PWB has the same nominal pad width as the terminal pads and the other sense pad is centered and is narrower by a sufficient amount so that if marginal contact is made between the pair, then sure contact is made between the functional pairs of terminal pads. In another embodiment, either the LCD or the PWB is provided with a single pad and the other is provided with a pair of sense pads, one on each side of the single pad. The pads of the pair are spaced such that if electrical contact is sensed on either of the pair of pads, then the alignment is out of acceptable tolerance, and if no contact is sensed the terminal pads are properly aligned.

In either case if a misalignment is detected the LCD is shifted relative to the PWB until alignment is perfected. The method using a pair of sensing pads on one side has the advantage that the direction of misalignment is revealed according to which pad is coupled to the other side. Both methods are well suited for automatic assembly.

BRIEF DESCRIPTION OF THE DRAWINGS

The above and other advantages of the invention will become more apparent from the following description taken in conjunction with the accompanying drawings wherein like references refer to like parts and wherein.

DESCRIPTION OF THE INVENTION

Figure 1:
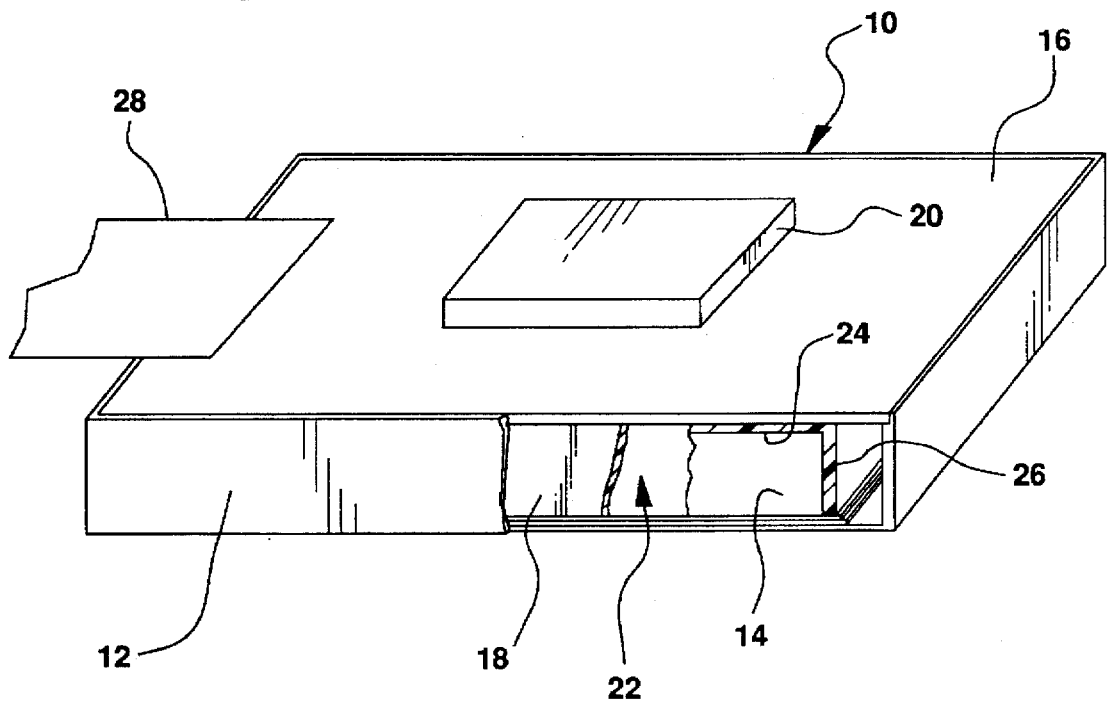
FIG. 1 is a partly broken away isometric view of an LCD display package having terminal pads requiring alignment.

Referring to FIG. 1, an LCD package 10 includes a housing 12, an LCD cell 14, a PWB 16 spaced from the LCD 14, and elastomeric connectors 18 (one on each side) to connect the PWB terminal pads to the LCD terminal pads. An IC driver chip 20 mounted on the PWB 16 is coupled by conductors, not shown, to terminal pads on the PWB. LEDs, not shown, on the PWB are held in the space between the LCD cell and the PWB to backlight the cell. A light box 22 comprising a white plastic material has a wall 24 adjacent the PWB and side walls 26 to efficiently distribute light from the LEDs to the LCD cell. A flexible circuit 28 attached to the PWB has conductors for supplying control signals and power to the IC driver 20.

Figure 2:
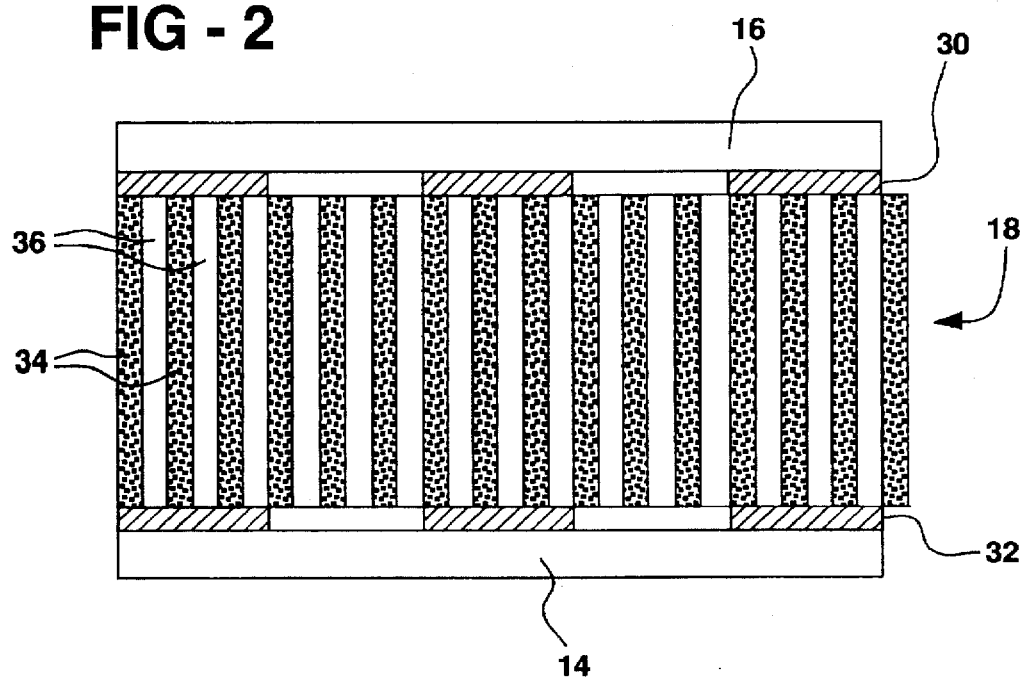
FIG. 2 is a schematic view of a connector and terminal pads according to an ideal configuration.

FIG. 2 shows a PWB 16 having terminals pads 30, an LCD 14 having terminals pads 32, and an elastomeric connector 18. The pads 30 and 32 are evenly spaced with the space width equal to the pad width, and each pad 32 is directly opposed to a pad 30. The connector 18 has alternate strips of conductive elements 34 and insulating separators 36, each strip being normal to the PWB and the LCD in the ideal configuration. The pitch of the conductive elements 34 is small enough that at least three elements 34 contact each pad 30 and 32, and three elements reside in the space between pads. Thus each pair of opposed pads 30 and 32 are connected by three conductive elements 34 in the ideal case.

Figure 3:
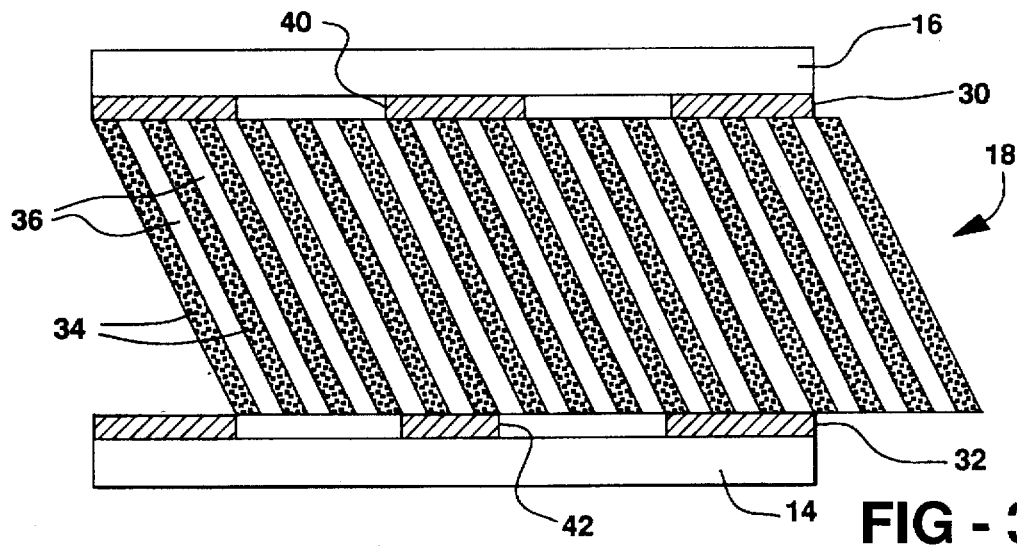
FIG. 3 is a schematic view of a connector and terminal pads showing special sense pads for alignment required by one embodiment of the method of the invention.

In the event that the connector elements are skewed from the ideal position, some of the three elements may not contact both the pads 30 and 32, and in extreme cases, none of the elements will contact both opposed pads. This condition is illustrated in FIG. 3. The contact can be made, however, by shifting the PWB or the LCD laterally until proper contact is made. To determine whether the parts are acceptably aligned, two opposed pads 40 and 42 on the terminal strip are designated as sense pads. These sense pads are equally spaced (center-to-center) from the adjacent regular terminal pads so that when the sense pads are aligned, all the pads will be aligned. A known voltage is applied to one of the pads and the other pad is tested for that voltage. This continuity test will reveal whether the opposed pads are connected by the elements 34, and if there is no continuity, the parts are shifted to achieve alignment.

There is a borderline case of alignment where the elements only marginally make contact so that a continuity check would not necessarily assure that all of the terminal pads have a good connection. To assure that this does not occur, at least one of the sense pads 40, 42 is narrower than the regular terminal pads. In FIG. 3, the sense pad 40 is the same size as the terminal pads and the sense pad 42 is smaller than pad 40. If desired, the pad 40 could be made smaller than pad 42. In any event, if a marginal contact is made between the sense pads, it is assured that a secure contact is made between the pairs of normal sized terminal pads.

Figure 4:
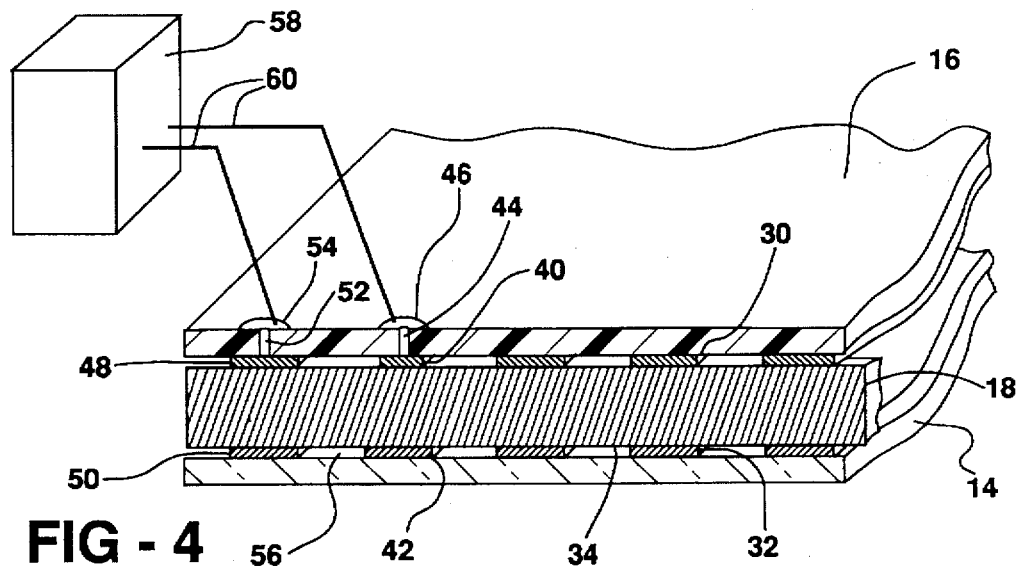
FIG. 4 is a sectioned isometric view of an LCD subassembly according to the FIG. 3 embodiment along with test equipment.

The implementation of the concept of FIG. 3 is presented in FIG. 4, which shows a PWB 16 connected to an LCD 14 by an elastomeric connector 18. The conductive elements 34 of the connector are skewed but not enough, in this example, to require adjustment of the PWB relative to the LCD. The terminal pads 30, 32 on the PWB 16 and the LCD 14, respectively, as well as a sense pad 42 on the LCD are equal in size and spacing, and a sense pad 40 on the PWB is narrower than the terminal pads but of equal spacing (center-to-center) with the adjacent terminal pads 30. The sense pad 40 is connected by a plated-through hole 44 to a contact pad 46 on the outer side of the PWB.

An electrical connection independent of connector alignment between the PWB and the LCD is required to carry out the continuity test between the sense pads. Connection pads 48 and 50 on the PWB and the LCD, respectively, and in engagement with opposite side of the connector 18, are sufficiently wide to assure connection by the connector, even though the connector might be skewed. The connection pad 48 on the PWB is coupled by a plated-through hole 52 to a contact pad 54 on the outer side of the PWB. The connection pad 50 of the LCD is connected to the sense pad 42 by a link 56 which is positioned to avoid contact by the connector. Accordingly, the connection pads and the sense pad 42 are coupled at the same voltage, and the sense pad 40 is also coupled to that voltage if the conductive elements 34 of the connector bridge the two sensor pads.

A test device 58 located at the assembly station includes a pair of probes 60 which are to be placed in contact with the contact pads 46 and 54, and a circuit, not shown, for supplying a known voltage on one of the probes 60 and for detecting the presence of that voltage on the other probe. Thus a test is made by contacting the pads 46 and 54 with the probes 60, applying the voltage and testing for the voltage. If the voltage is present the connector alignment is certified and if it is not present, the PWB is shifted laterally relative to the LCD and the test is repeated. If the voltage is not present, it is not apparent from a test which direction the shift should be to correct the alignment.

Figure 5:
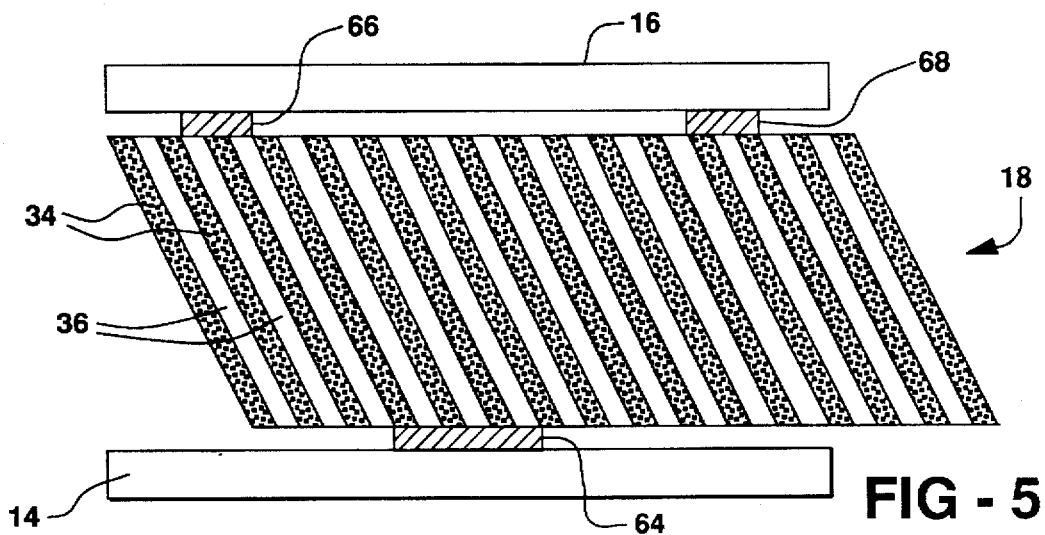
FIG. 5 is a schematic view of a connector and terminal pads showing special sense pads for alignment required by another embodiment of the method of the invention.

FIG. 5 shows a sense pad configuration which is useful to detect misalignment as well as the direction of misalignment. The terminal pads are not included in this view. A sense pad 64 on the LCD 14 has the same width as regular terminal pads, and two sense pads 66 and 68 on the PWB 16 are spaced on either side of the pad 64 such that in the case of acceptable connector alignment neither of the pads 66 and 68 will be connected to the pad 64. If, however, there is misalignment, the sense pad 64 will be connected to one of the pads 66 and 68, depending on the direction of misalignment. This configuration would be implemented as in FIG. 4 except that there would be three contact pads on the outer surface of the PWB and the circuit would make separate continuity checks for the pads 66 and 68.

It will then be seen that the method described here including forming appropriate sense pads and testing continuity between them permits determination of connector alignment between the PWB and the LCD. When misalignment is indicated, the PWB and LCD are adjusted and retested. Inexpensive test equipment is required and the formation of special pads on the PWB and the LCD is accomplished at no expense during the formation of terminal pads and other conventional processes performed on the PWB. It will be appreciated that the invention is applicable to mating an LCD to a flexible wiring circuit as well as to a rigid PWB. It is also applicable to mating a flexible circuit to a rigid PWB.

The embodiments of the invention in which an exclusive property or privilege is claimed are defined as follows:

1. In the manufacture of a liquid crystal display (LCD) having a plurality of spaced terminal pads coupled to corresponding terminal pads on a printed wiring board (PWB) via an elastomeric connector having parallel conductive paths extending between LCD pads and PWB pads, the connector conductive paths being subject to skewing away from a direction normal to the PWB, a method of aligning the conductive paths and the pads for proper connection comprising the steps of:

forming sense pads on the LCD and the PWB, the sense pads being aligned with the terminal pads and being configured to define a predetermined relationship with the conductive paths when properly assembled;

assembling the LCD, the elastomeric connector and the PWB in a stack with the LCD terminal pads approximately aligned with corresponding PWB pads;

testing for circuit continuity between the sense pads on the LCD and the PWB to determine terminal pad and connector alignment; and if the terminal pads and the connector are not aligned as determined by the testing step, shifting the LCD relative to the PCB to bring the terminal pads and connector into alignment for correct electrical coupling.

2. The invention as defined in claim 1 wherein the sense pads contacting opposite sides of the connector have different widths, one pad width being comparable to the terminal pads and the other pad width being smaller than the terminal pads.

3. The invention as defined in claim 1 wherein each of the LCD and the PWB has a single sense pad; and the testing step comprises determining alignment when the sense pads are electrically coupled.

4. The invention as defined in claim 1 wherein the step of testing continuity comprises applying a voltage at one of the sense pads and detecting voltage on the other of the sense pads.

5. The invention as defined in claim 1 wherein one of the LCD and the PWB has one sense pad and the other has a spaced pair of sense pads arranged such that there is no electrical coupling of the one pad to either of the pair of pads when the terminal pads are properly aligned with the conductive paths.

6. The invention as defined in claim 5 wherein the testing step determines misalignment of the terminal pads and connector when the one sense pad is coupled to one of the pair of pads.

7. The invention as defined in claim 5 wherein the one sense pad is commensurate in size with the terminal pads and the pads of the pair are smaller than the one pad.

8. The invention as defined in claim 5 wherein the pair of pads are arranged such that there is electrical coupling of the one pad to either pad of the pair of pads when the terminal pads are not aligned with the conductive paths.

9. In the assembling of a liquid crystal display (LCD) having a plurality of spaced terminal pads to a printed wiring board (PWB) having corresponding terminal pads with an elastomeric connector having parallel conductive paths extending between LCD pads and PWB pads, a method of determining alignment of the terminal pads with the conductive paths comprising the steps of:

forming sense pads on the LCD and the PWB, the sense pads being configured to define a predetermined relationship with the conductive paths when properly assembled;

assembling the LCD, the elastomeric connector and the PWB in a stack with the LCD terminal pads approximately aligned with corresponding PWB pads; and testing for circuit continuity between the sense pads on the LCD and the PWB to determine terminal pad and connector alignment, whereby a closed circuit between corresponding sense pads is an indication of whether corresponding terminal pads are properly interconnected.

10. The invention as defined in claim 9 wherein the step of forming sense pads comprises:

arranging the LCD and PWB sense pads to be in alignment with conductive paths when the terminal pads are also in alignment with conductive paths, whereby a closed circuit during testing indicates proper connection of terminal pads.

11. The invention as defined in claim 9 wherein the step of forming sense pads comprises:

arranging the LCD and PWB sense pads to be out of alignment with conductive paths when the terminal pads are in alignment with the conductive paths, whereby an open circuit during testing indicates proper connection of terminal pads.

12. The invention as defined in claim 9 wherein the step of testing continuity comprises applying a voltage at one of the sense pads and detecting voltage on the other of the sense pads.

13. The invention as defined in claim 9 wherein one of the LCD and the PWB has one sense pad and the other has a spaced pair of sense pads arranged such that there is no electrical coupling of the one pad to either of the pair of pads when the terminal pads are properly aligned with the conductive paths.

14. The invention as defined in claim 9 further including:

forming a pair of contact pads on the PWB, one of the contact pads being connected to the sense pad on the PWB and the other contact pad being arranged for coupling through the connector to the sense pad on the LCD; and the testing step comprises testing the continuity between the contact pads.

15. The invention as defined in claim 14 wherein the testing step comprises applying a known voltage on one of the contact pads and testing for the known voltage on the other of the contact pads.

* * * * *